US006185703B1

(12) United States Patent
Guddat et al.

(10) Patent No.: US 6,185,703 B1
(45) Date of Patent: *Feb. 6, 2001

(54) METHOD AND APPARATUS FOR DIRECT ACCESS TEST OF EMBEDDED MEMORY

(75) Inventors: Douglas A. Guddat, Portland, OR (US); James M. Cleary, San Jose, CA (US); Tsafrir Israeli, Haifa (IL)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/948,716

(22) Filed: Oct. 10, 1997

(51) Int. Cl.[7] .................................................. G06F 12/00
(52) U.S. Cl. ............................................ 714/718; 711/3
(58) Field of Search .................. 711/3, 118; 395/183.01, 395/183.18; 714/25, 42, 718

(56) References Cited

U.S. PATENT DOCUMENTS

| 4,575,792 | * | 3/1986 | Keeley | 364/200 |
|---|---|---|---|---|
| 4,969,148 | * | 11/1990 | Nadeau-Dostie et al. | 371/21.1 |
| 5,249,281 | * | 9/1993 | Fuccio et al. | 395/425 |
| 5,479,652 | | 12/1995 | Dreyer et al. | |
| 5,596,734 | * | 1/1997 | Ferra | 395/825 |
| 5,663,965 | * | 9/1997 | Seymour | 371/22.31 |
| 5,828,825 | * | 10/1998 | Eskandari et al. | 395/183.03 |
| 5,835,504 | * | 11/1998 | Balkin et al. | 371/21.6 |
| 5,875,293 | * | 2/1999 | Bell et al. | 395/183.03 |
| 5,923,675 | * | 7/1999 | Brown et al. | 371/22.31 |

* cited by examiner

Primary Examiner—Eddie P. Chan
Assistant Examiner—Kevin Verbrugge
(74) Attorney, Agent, or Firm—Blakely, Sokoloff, Taylor & Zafman LLP

(57) ABSTRACT

An apparatus includes an embedded memory, a plurality of input connectors to receive input signals from an external source, a plurality of output connectors to provide output signals to the external source, and a plurality of reconfigurable input and output signal paths coupled to the embedded memory and the plurality of input and output connectors. When the apparatus is operating in a first operating mode, the plurality of reconfigurable input and output signal paths provide the input signals directly to and the output signals directly from the embedded memory.

10 Claims, 5 Drawing Sheets

METHOD AND APPARATUS FOR DIRECT ACCESS TEST OF EMBEDDED MEMORY

BACKGROUND OF THE INVENTION

1. Field of the Invention

The present invention pertains to memories and memory testing. More particularly, this invention relates to direct access testing of embedded memory.

2. Background

Continual advances in processor technology have led to continual increases in the functionality provided in a single processor chip. One example of such functionality is on-chip memories, often referred to as cache memories. On-chip cache memories provide storage of data and/or instructions as well as various other control and/or address information for use by the execution unit(s) and other internal logic of the processor. These on-chip cache memories are typically very fast memories, with the combination of their speed as well as their close physical locality to the execution unit(s) and other internal logic leading to fast memory accesses for the information stored in these memories.

However, the fabrication of memories does not produce perfect results and, therefore, processors will occasionally be fabricated which have faulty memories. The faults may be complete failure of the memory cells, failure of particular cells, failure only under certain circumstances, etc. Therefore, given that processors with such faulty memories may be fabricated, it would be beneficial to provide a way to test the embedded memories to verify their performance. Unfortunately, given the embedded nature of these memories, it is typically not possible to directly access them from external to the processor, thereby making testing very difficult.

An additional concern in testing embedded memory is the amount of chip "real estate" which is taken up by the testing logic. Once operation of the embedded memory has been verified the testing of the embedded memory is typically not repeated. Therefore, it would be preferable to reduce the amount of chip real estate used for logic dedicated solely to the testing of the embedded memory.

One solution to testing embedded memories is to generate a software test program which, when executed by the execution unit(s) of the processor, requires the use of the embedded memories. By carefully selecting the instructions and data for testing, portions of the embedded memories can be checked and performance verified. However, this solution requires very careful planning by the test program designer and a thorough knowledge of the overall processor architecture in order for the designer to know how the instructions will be executed and information stored in the memories. Furthermore, this solution makes it very difficult to exactly identify which particular memory cell malfunctioned in response to which particular instruction.

Thus, a need exists for improved testing of embedded memories.

SUMMARY OF THE INVENTION

An apparatus is disclosed which includes an embedded memory, a plurality of input connectors to receive input signals from an external source, a plurality of output connectors to provide output signals to the external source, and a plurality of reconfigurable input and output signal paths coupled to the embedded memory and the plurality of input and output connectors. When the apparatus is operating in a first operating mode, the plurality of reconfigurable input and output signal paths provide the input signals directly to and the output signals directly from the embedded memory.

A method is disclosed which includes checking whether a direct access test mode is selected and receiving input signals from an external source. If the direct access test mode is selected, the input signals are provided directly to an embedded memory.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, various aspects of the present invention will be described. However, it will be understood by those skilled in the art that the present invention may be practiced with only some or all aspects of the present invention. For purposes of explanation, specific numbers, materials and configurations are set forth in order to provide a thorough understanding of the present invention. However, it will also be apparent to those skilled in the art that the present invention may be practiced without these specific details.

In the discussions to follow, certain signals are discussed followed by a "#". This notation is used to indicate a signal which is active when in a low state (that is, a low voltage). It is to be appreciated, however, that the present invention may be implemented where these signals are active when in a high state rather than when in a low state. Similarly, the present invention may be implemented where signals discussed herein which are not followed by a "#" are active when in a low state.

Figure 1:
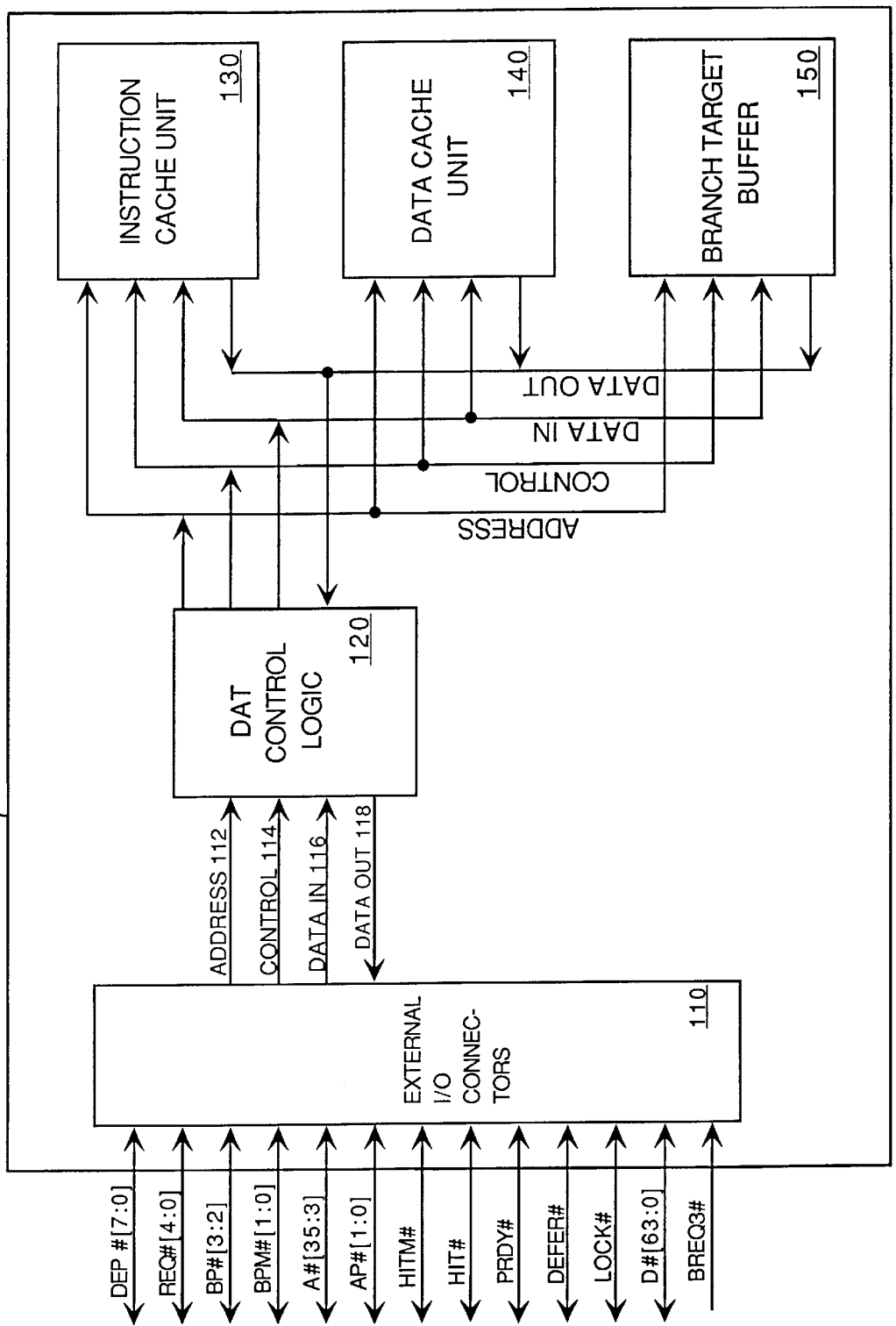
FIG. 1 is a block diagram illustrating the direct access testability of embedded memory in a processor according to one embodiment of the present invention.

FIG. 1 is a block diagram illustrating the direct access testability of embedded memory in a processor according to one embodiment of the present invention. As illustrated, processor 100 includes external input/output (I/O) connectors 110, direct access test (DAT) control logic 120, instruction cache unit 130, data cache unit 140, and branch target buffer (BTB) 150, coupled together as illustrated. The memory arrays of instruction cache 130, data cache 140, and branch target buffer 150 are referred to as "embedded memories". It is to be appreciated that processor 100 includes additional logic and circuitry, such as registers, execution unit(s), etc. However, this additional logic and circuitry has not been shown so as not to clutter the drawings.

Instruction cache unit 130, also referred to as an instruction fetch unit (IFU), includes a 16 k byte cache memory made up of static random access memory (SRAM) cells and associated control logic. In one implementation, instruction cache 130 is organized as a four-way set associative cache with 128 lines (sets) of 32 bytes each. Instruction cache 130 includes a data portion, a tag portion, and a control portion and is used to store instructions which are used, or expected to be used, by the execution unit(s) of processor 100. Instruction caches are well-known to those skilled in the art and thus will not be discussed further except as they pertain to the present invention.

Data cache 140 includes a 16 k byte cache memory made up of SRAM cells and associated control logic. In one implementation, data cache 140 is organized as a four-way set associative cache with 128 lines of 32 bytes each. Data cache 140 includes a data portion, a tag portion, and a control portion and is used to store data which is used, or expected to be used, by the execution unit(s) of processor 100. Data caches are well-known to those skilled in the art and thus will not be discussed further except as they pertain to the present invention.

Branch target buffer 150 includes a memory array made up of SRAM cells and associated control logic. In one implementation, branch target buffer 150 is organized as a four-way set associative cache with 128 lines per way. Branch target buffer 150 stores addresses of branch instructions as well as information predicting whether the branches will be taken when the instructions are executed. The branch target buffer is used to determine, based on whether the branch is taken, which address should be used to continue pre-fetching instructions. Branch target buffers are well-known to those skilled in the art and thus will not be discussed further except as they pertain to the present invention.

External I/O connectors 110 provide the input and output connections for processor 100. Address, data, and control information is input to and output from processor 100 via external I/O connectors 110. In one implementation, external I/O connectors 110 are a plurality of pins which interface between an external circuit board and processor 100. However, in alternate implementations different connecting mechanisms or devices are used. In one such alternate implementation, processor 100 is designed to be surface mounted to a circuit board without the use of pins. In this alternate implementation, external I/O connectors 110 are electrical connection points which, when processor 100 is affixed to the circuit board, are placed in electrical contact with the signal lines on the circuit board.

According to one embodiment of the present invention, processor 100 can function in either a DAT mode or a "normal" mode. DAT mode is the direct access test mode which makes the embedded memories externally directly accessible. External commands can directly read from and write to particular locations within the embedded memories in DAT mode. Normal mode refers to the normal operating mode (non-DAT mode) of processor 100, in which the embedded memories are not externally directly accessible.

In the illustrated embodiment, processor 100 is initialized into either DAT mode or normal mode at system reset based on the A#[30] signal from the external bus. If the A#[30] signal is in a first state (e.g., asserted) then processor 100 is operating in DAT mode. Otherwise, processor 100 is operating in normal mode. In one implementation the value of the A#[30] signal is stored in a configuration register (not shown) during reset and is used during operation of processor 100 to enable or disable various signal drivers, as discussed in more detail below.

In the illustrated embodiment, the A#[30] signal is either asserted or deasserted at reset by external configuration logic. In alternate embodiments, the A#[30] signal is hard-wired to a particular value, tied to a value in a Flash memory device or other EEPROM, configurable using jumpers, etc. Additionally, in alternate embodiments a signal(s) other than the A#[30] signal is used to enable/disable DAT mode.

As illustrated, address signals 112, control signals 114, and data in signals 116 are input to DAT control logic 120 from external I/O connectors 110, and data out signals 118 are output from DAT control logic 120 to external I/O connectors 110. In the illustrated embodiment, address and control signals 112 and 114 include sufficient information to identify to DAT control logic 120 a particular 32-bit double word (DWORD) within the embedded memories.

Address, control, and data signals 112, 114, 116, and 118 are routed to DAT control logic 120. When processor 100 is operating in DAT mode, address, control, and data signals 112, 114, 116, and 118 are "re-routed" by DAT control logic 120 and used to access instruction cache 130, data cache 140, and branch target buffer 150. However, when operating in normal mode, DAT control logic 120 does not re-route the address, control, and data signals 112, 114, 116, and 118, which are thus routed to the normal internal circuitry for normal operation of processor 100.

Table I describes the information which is encoded on the address and control signals 112 and 114 while operating in DAT mode.

TABLE I

| Signal | Description |
|---|---|
| ARREN[2:0] | Array Enable. Identifies which of the embedded memories is to be accessed. In the illustrated embodiment one of the following seven arrays can be identified: instruction cache data array, instruction cache tag array, data cache data array, data cache tag array, branch target buffer data array, branch target buffer tag (address) array, and branch target buffer pattern table memory array. |
| 3xCMD[3:0] | Command. Identifies the particular command for the access. |
| 4xSet[6:0] | Set Identifier. Identifies which of the multiple sets within a particular array is to be accessed. |
| 3xway[1:0] | Way Identifier. Identifies which of the multiple ways within a particular array is to be accessed. |
| 3xBANK[1:0] | Bank Identifier. Identifies which particular bank of memory within an array is to be accessed. In one embodiment, the bank identifier is used only for writes to the data cache data array and instruction cache data array. |
| DWORD[2:0] | Double Word Identifier. Identifies which of multiple double words within a particular set is to be accessed. In one embodiment, the Double Word Identifier is used for reads from the memory arrays and writes to arrays other than the data cache data array and instruction cache data array. |

Although specific numbers of bits for particular signals are identified, it is to be appreciated that these numbers will vary based on the structure of the embedded memories being used. By way of example, two bits are used for a four-way associative cache memory. However, if processor 100 only included two-way associative cache memories, than a single bit would be sufficient.

Additionally, it should be noted that in some instances three or four groups of information (identified by the "3x" or "4x" in Table I) are provided to DAT control logic 120. Three groups of some signals are used due to the differences in bus clock and core clock frequencies, as discussed in more detail below. Four groups of Set Identifier signals are used due to the dual-ported nature of some of the memory arrays, as discussed in more detail below.

According to one embodiment of the present invention, write accesses to the data cache data array and the instruction cache data array are 64-bit accesses. Thus, the Bank Identifiers are used to identify a particular 64-bit portion of a set which is to be accessed for a write. For other accesses to the memory arrays, the Double Word Identifiers are used to identify a particular 32-bit double word of a set which is to be accessed.

In the illustrated embodiment, the Double Word Identifiers are only needed to access memory arrays with sets which are greater than 32 bits. It is to be appreciated that for memory arrays with sets which are 32 bits or less it is not necessary to identify a particular 32-bit portion. Similarly, the Bank Identifiers would not be needed if the data cache data array and instruction cache data array sets were 64 bits or less.

Table II shows the correspondence between address, control, and data signals 112, 114, 116, and 118 in DAT mode and the signals the lines carry during normal mode.

TABLE II

| DAT mode signal | Non-DAT mode signal |
|---|---|
| DAT enable | Address line 30 (A#30). |
| ARREN[2:0] | Address lines 33–35 (A#[35:33]). |
| CMD1[3:0] | Data Even Parity lines 4–7 (DEP#[7:4]). |
| CMD2[3:0] | Request lines 0–3 (REQ#[3:0]). |
| CMD3[3:0] | Breakpoint lines 2–3 (BP#[3:2]), and Breakpoint and Performance Monitor lines 0–1 (BPM#[1:0]). |
| Set1[6:0] | Address lines 5–11 (A#[11:5]). |
| Set2[6:0] | Address lines 12–18 (A#[18:12]). |
| Set3[6:0] | Address lines 19–25 (A#[25:19]). |
| Set4[6:0] | Address lines 26–32 (A#[32:26]). |
| Way1[1:0] | Data Even Parity lines 2–3 (DEP#[3:2]). |
| Way2[1:0] | Address lines 3–4 (A#[4:3]). |
| Way3[1:0] | Request line 4 (REQ#[4]) and Bus Request line 3 (BREQ#[3]). |
| BANK1[1:0] | Data Even Parity lines 0–1 (DEP#[1:0]). |
| BANK2[1:0] | Address Parity lines 0–1 (AP#[1:0]). |
| BANK3[1:0] | Modified hit (HITM#) and Hit (HIT#) lines. |
| DWORD[2:0] | Processor Stopped Normal Execution (PRDY#), Defer (DEFER#), and Bus Lock (LOCK#). |
| Data In | Data lines 0–31 ([D#[31:0]). |
| Data Out | Data lines 32–63 ([D#[63:32]). |

When operating in DAT mode the array enable signals identify which of the embedded memories is to be enabled for access, and thus which is to act upon a particular command. Along with the array enable signals, DAT control logic 120 forwards the Set, Way, DWORD, Bank, and Command signals to the embedded array. Any data which is read out is returned to DAT control logic 120, which, when operating in DAT mode, routes the output data as data out signals 118.

The values used to encode the array enable information are identified in Table III below. Similarly, the values used to encode the Way selection are identified in Table IV, the values used to identify the DWORD selection are identified in Table V, and the used to identify the Bank selection are identified in Table VI.

TABLE III

| Value | Array Selection |
|---|---|
| 000 | No array selected. |
| 001 | BTB Address (Tag) array. |
| 010 | BTB Pattern Table array. |
| 011 | BTB Target (Data) array. |
| 100 | DCU Data array. |
| 101 | DCU Tag array. |
| 110 | IFU Data array. |
| 111 | IFU Tag array. |

TABLE IV

| Value | Way Selection |
|---|---|
| 00 | 0 |
| 01 | 1 |
| 10 | 2 |
| 11 | 3 |

TABLE V

| Value | DWORD Selection |
|---|---|
| 000 | DWORD 0 |
| 001 | DWORD 1 |
| 010 | DWORD 2 |
| 011 | DWORD 3 |
| 100 | DWORD 4 |
| 101 | DWORD 5 |
| 110 | DWORD 6 |
| 111 | DWORD 7 |

TABLE VI

| Value | Bank Selection |
|---|---|
| 00 | Bank 0 |
| 01 | Bank 1 |
| 10 | Bank 2 |
| 11 | Bank 3 |

According to one embodiment of the present invention several external signals are driven to default values or voltage levels so that they are at a known state and do not interfere with the DAT mode. These signals, according to one implementation, are identified in Table VII.

TABLE VII

| Signal | Default Value |
|---|---|
| Address bit 20 mask (A20M#). | High Voltage |
| Address strobe (ADS#). | High Voltage |
| Bus Initialize (BINIT#). | High Voltage |
| Priority Agent Bus Request (BPRI#). | High Voltage |
| Data Bus Busy (DBSY#). | High Voltage |
| Data Ready (DRDY#). | High Voltage |
| Cache Flush (FLUSH#). | High Voltage |
| Ignore Numeric Error (IGNNE#). | High Voltage |
| Initialize (INIT#). | High Voltage |
| Local Interrupt (LINTO#[1:0]). | Low Voltage (both lines) |
| Probe Mode Request (PREQ#). | High Voltage |
| Request Parity (RP#). | High Voltage |
| Response Status (RS[2:0]). | Low Voltage (all three lines) |
| Response Parity (RSP#). | High Voltage |
| System Management Interrupt (SMI#). | High Voltage |

TABLE VII-continued

| Signal | Default Value |
| --- | --- |
| Test Data Input (TDI). | Low Voltage |
| Test Mode Select (TMS). | Low Voltage |
| Test Reset (TRST#). | High Voltage |

Table VIII identifies the commands which are supported in the DAT mode according to one embodiment of the present invention.

TABLE VIII

| Command | Description |
| --- | --- |
| NOP | No operation. |
| Write | Write data to a particular DWORD. |
| Read | Read data from a particular DWORD. Note, however, that there is no data output from DAT control logic 120 for this command. |
| Snoop | Snoop at a particular DWORD. |
| Write Port n | Write data to port "n" of a DWORD of a multi-port memory. |
| Read Port n | Read data from port "n" of a DWORD of a multi-port memory. Note, however, that there is no data output from DAT control logic 120 for this command. |
| Read with Data Output | Read data from a particular DWORD. The read data is DAT control logic 120. |
| Snoop with Data Output | Snoop a particular DWORD. The snooped data is output from DAT control logic 120. |
| Read Port n with Data Output | Read data from port "n" of a DWORD of a multi-port memory. The read data is output from DAT control logic 120. |

Upon receipt of one of these commands by DAT control logic 120, DAT control logic 120 forwards the received command, along with the appropriate set, way, bank and data, if any, to instruction cache 130, data cache 140, or branch target buffer 150. In the illustrated embodiment, additional command decode logic (not shown) is included in each of instruction cache 130, data cache 140, and branch target buffer 150. This additional command decode logic decodes a received command into control signals for accessing the memory array to perform the requested function. It will be appreciated by those skilled in the art that this decoding is dependent on the encoding of the commands as well as the specific signals expected by the memory arrays. The design of such decoding logic is well-known to those skilled in the art, and thus will not be discussed further.

In the illustrated embodiment address, control, and data signals are input to the instruction cache 130, data cache 140, and branch target buffer 150 from DAT control logic 120. Additional address, control, and data signals from other portions of the processor (not shown) are also input to cache 130, data cache 140, and branch target buffer 150. In one implementation, these signals from the other portions of the processor are multiplexed with the signals from DAT control logic 120 and selected ones of the signals are forwarded to the memory arrays of cache 130, data cache 140, and branch target buffer 150. In this implementation, the DAT enable signal is used to select the signals from DAT control logic 120 as the inputs to the memory arrays of cache 130, data cache 140, and branch target buffer 150 rather than the signals from other sources.

In an alternate embodiment of the present invention, DAT control logic 120 includes translation logic to generate the appropriate signals to cache 130, data cache 140, and branch target buffer 150 so that cache 130, data cache 140, and branch target buffer 150 believe that the commands are actually those received from other logic within processor 100. Thus, in this alternate embodiment, additional decode logic is not needed in cache 130, data cache 140, and branch target buffer 150.

According to one embodiment of the present invention, various commands are available for the different memory arrays. Table IX identifies these commands and the values used to encode them according to one implementation of the present invention.

| Array Enabled | Value | DAT Function |
| --- | --- | --- |
| No array selected | 0000 | NOP |
| BTB Address array | 0000 | NOP |
| | 0001 | Address Read |
| | 0010 | Address Read with data output |
| | 0011 | Address Write |
| BTB Pattern Table array | 0000 | NOP |
| | 0001 | Pattern Table Read |
| | 0010 | Pattern Table Read with data output |
| | 0011 | Pattern Table Write |
| BTB Target array | 0000 | NOP |
| | 0001 | Target Read |
| | 0010 | Target Read with data output |
| | 0011 | Target Write |
| DCU Tag array | 0000 | NOP |
| | 0001 | Tagport 2 Read |
| | 0010 | Tag port 2 Read with Data output |
| | 0011 | Tag port 2 Read and Tag port 2 Write |
| | 0100 | Tag port 2 Read with data output and Tag port 2 Write |
| | 0101 | Tag port 3 Read |
| | 0110 | Tag port 3 Read with data output |
| | 0111 | Tag port 2 Read and Tag port 3 Read |
| | 1000 | Tag port 2 Read with data output and Tag port 3 Read |
| | 1001 | Tag port 3 Read with data output and Tag port 2 Read |
| DCU Data array | 0000 | NOP |
| | 0001 | Data Read |
| | 0010 | Data Read with data output |
| | 0011 | Data Write |
| IFU Data array | 0000 | NOP |
| | 0001 | DataRead |
| | 0010 | Data Read with Data output |
| | o011 | Data Write |
| IFU Tag array | 0000 | NOP |
| | 0001 | Tag Read |
| | 0010 | Tag Read with data output |
| | 0011 | Tag Write |
| | 0100 | Tag Snoop |
| | 0101 | Tag Read and Tag Snoop |
| | 0110 | Tag Read with data output and Tag Snoop |
| | 0111 | Tag Write and Tag Snoop |
| | 1000 | Tag Snoop with data output |
| | 1001 | Tag Read and Tag Snoop with data output |
| | 1010 | Tag Write and Tag Snoop with data output |

Thus, when operating in DAT mode, externally generated signals are supplied to processor 100 via external I/O connectors 110. The address, control, and data information is supplied to DAT control logic 120, which in turn forwards the correct information to access a particular portion of a memory array. The request is then carried out by the particular embedded memory with data and/or control signals being returned to DAT control logic 120 as appropriate. In the illustrated embodiment, data from a Read request to the BTB or instruction cache is valid five bus clock cycles after the command is input to processor 100, and data from a Read request to the data cache is valid four bus clock cycles after the command is input to processor 100. Thus, an "SRAM pipeline" is established to access the embedded memories, allowing multiple commands to be in various stages of completion at any particular time.

According to one embodiment of the present invention, the clock frequency at which the external bus coupled to processor 100 operates and the clock frequency at which the internal logic of processor 100, referred to as the "processor core", operates are two different frequencies. In the illustrated embodiment, the ratio of the core clock frequency to the bus clock frequency is 3:1. Thus, in the illustrated embodiment processor 100 can accept three commands in parallel in DAT mode in a single clock cycle. These three commands are provided to DAT control logic 120, which in turn submits the commands serially to the embedded memories. Thus, in this embodiment, back-to-back operations to the embedded memories can be made despite the differences in core and bus clock frequencies.

In the illustrated embodiment data input and output in DAT mode occurs in 32-bit quantities. In this embodiment, 32 bits of the external data bus are used for data input and 32 bits of the external data bus are used for data output. Thus, the external data bus is a single 64-bit bi-directional bus when operating in normal mode, and two 32-bit unidirectional data buses when operating in DAT mode. Because there is only one 32-bit input data bus and one 32-bit output data bus, only one data input and one data output can occur per bus clock cycle. Thus, only one of every group of three commands executed according to the core clock can include a data input and only one of every group of three commands executed according to the core clock can include a data output.

As discussed above, data accesses to certain embedded memory arrays are 64-bit accesses even though only 32 bits of input data are available. In the illustrated embodiment, the 32 bits of input data are used as the upper 32 bits of the 64-bit data access as well as the lower 32 bits of the 64-bit data access. Thus, a full 64-bit data access is made even though only 32 bits of input data are available.

The above discussion describes direct access testability of certain memory arrays within a processor. It is to be appreciated that DAT control logic 120 discussed above could be designed to test only a portion of the embedded arrays discussed or could be designed to test additional embedded arrays. Examples of additional arrays include data and/or instruction parity information, least recently used (LRU) information, etc. Although the present invention makes substantial use of pre-existing hardware and circuitry within the processor, some additional circuitry is required to add direct access testability to different embedded arrays. Which arrays and how many arrays to provide direct access testability to is a matter of design choice, balancing the desire to accurately test the embedded memories of a processor against the additional cost and chip real estate of adding direct access testability to other arrays.

Figure 2:
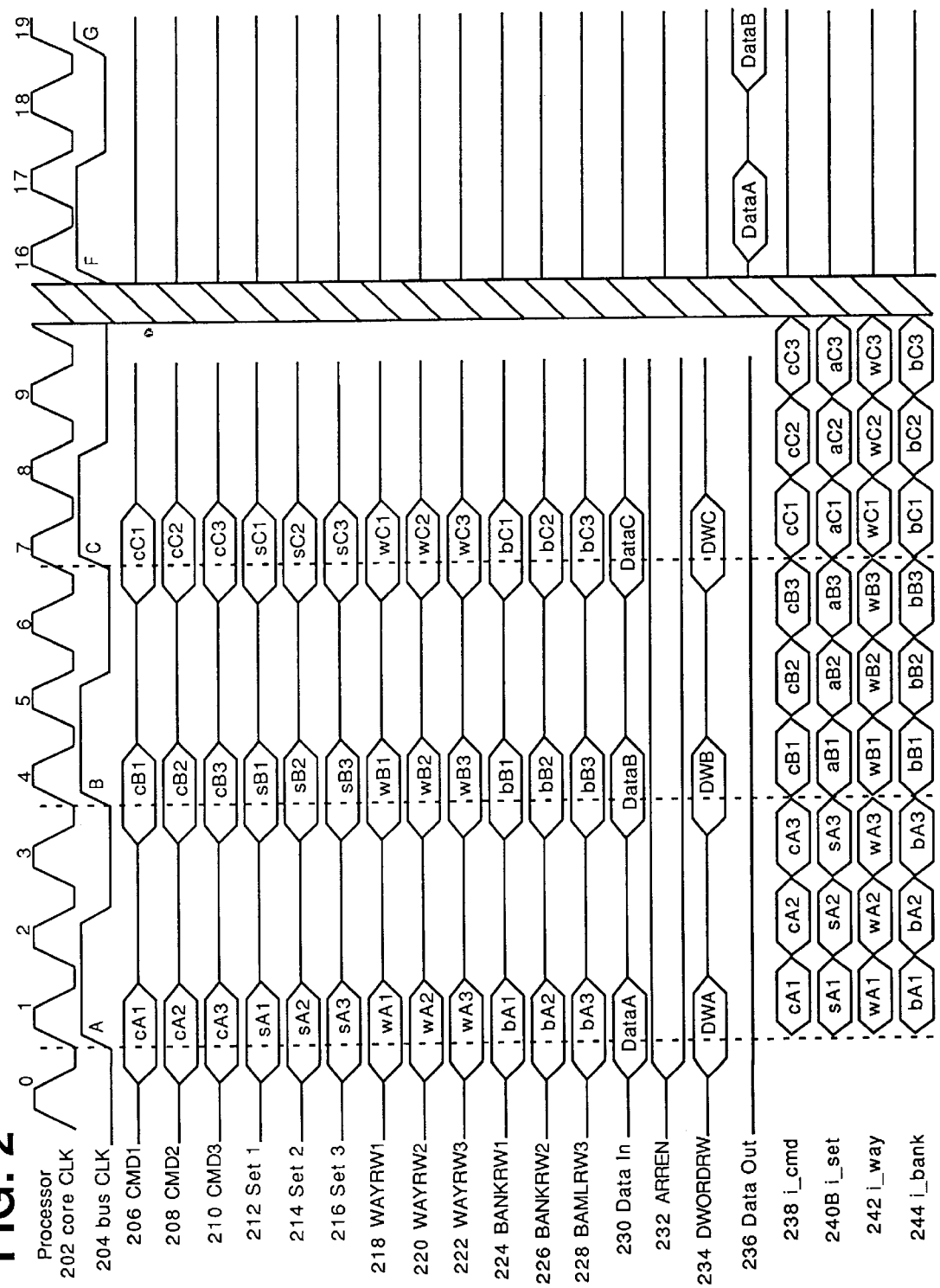
FIG. 2 is a timing diagram illustrating the parallel command specification/serial execution according to one embodiment of the present invention.

FIG. 2 is a timing diagram illustrating the parallel command specification/serial execution according to one embodiment of the present invention. As illustrated, the processor core clock (CLK) 202 has a frequency three times the bus CLK 204 frequency. Five bus clock 204 cycles are illustrated in FIG. 2 labeled as "A", "B", "C", "F", and "G". The lines between bus clock 204 cycle C and bus clock 204 cycle F represent two bus clock 204 cycles. In each of the bus clock 204 cycles A, B, and C, three commands (CMDs) are input to processor 100, illustrated as CMD1 206, CMD2 208, and CMD3 210. Additionally, three groups of "Set" data are input to processor 100 in each of the bus clock 204 cycles, illustrated as Set1 212, Set2 214, and Set3 216. Each of the three groups of set data corresponds to one of the commands input to processor 100. Similarly, three groups of Way information corresponding to the commands are input to processor 100 in each of the bus clock 204 cycles, illustrated as Wayrw1 218, Wayrw2 220, and Wayrw3 222, and three groups of Bank information corresponding to the commands are input to processor 100 in each of the bus clock 204 cycles, illustrated as Bankrw1 224, Bankrw2 226, and Bankrw3 228.

Additionally, one 32-bit group of data is input to processor 100 in each of the bus clock 204 cycles A, B, and C. As discussed above, only 32 bits of data can be input per bus clock cycle. Array enable signals 232 are also received in each of the bus clock 204 cycles, as are DWORD signals 234. In the illustrated embodiment array enable signals 232 and DWORD signals 234 can change no more frequently than every bus clock 204 cycle. However, in alternate embodiments enable signals 232 and DWORD signals 234 can change each core clock 202 cycle.

Upon receipt of the command, set, way, bank, and data signals, DAT control logic 120 forwards the command 238, set 240, way 242 and bank 244 information for the first of the commands to the identified embedded memory in the first core clock 202 cycle. Similarly, DAT control logic 120 forwards the command 238, set 240, way 242 and bank 244 information for the second of the commands to the identified embedded memory in the second core clock 202 cycle, and forwards the command 238, set 240, way 242 and bank 244 information for the third of the commands to the identified embedded memory in the third core clock 202 cycle. By the fourth core clock 202 cycle, a new set of three commands and associated information via external I/O connectors 110 has been received.

Data corresponding to a read request from CMD1 206, CMD2 208 or CMD3 210 of bus clock 204 cycle A is available on data out signals 236 in bus clock 204 cycle F. Similarly, data corresponding to a read request from CMD1 206, CMD2 208 or CMD3 210 of bus clock 204 cycle B is available on data out signals 236 in bus clock 204 cycle G.

Thus, as can be seen in FIG. 2, back to back operations to memory cells can be maintained despite the differences in bus and core clock frequencies.

Figure 3:
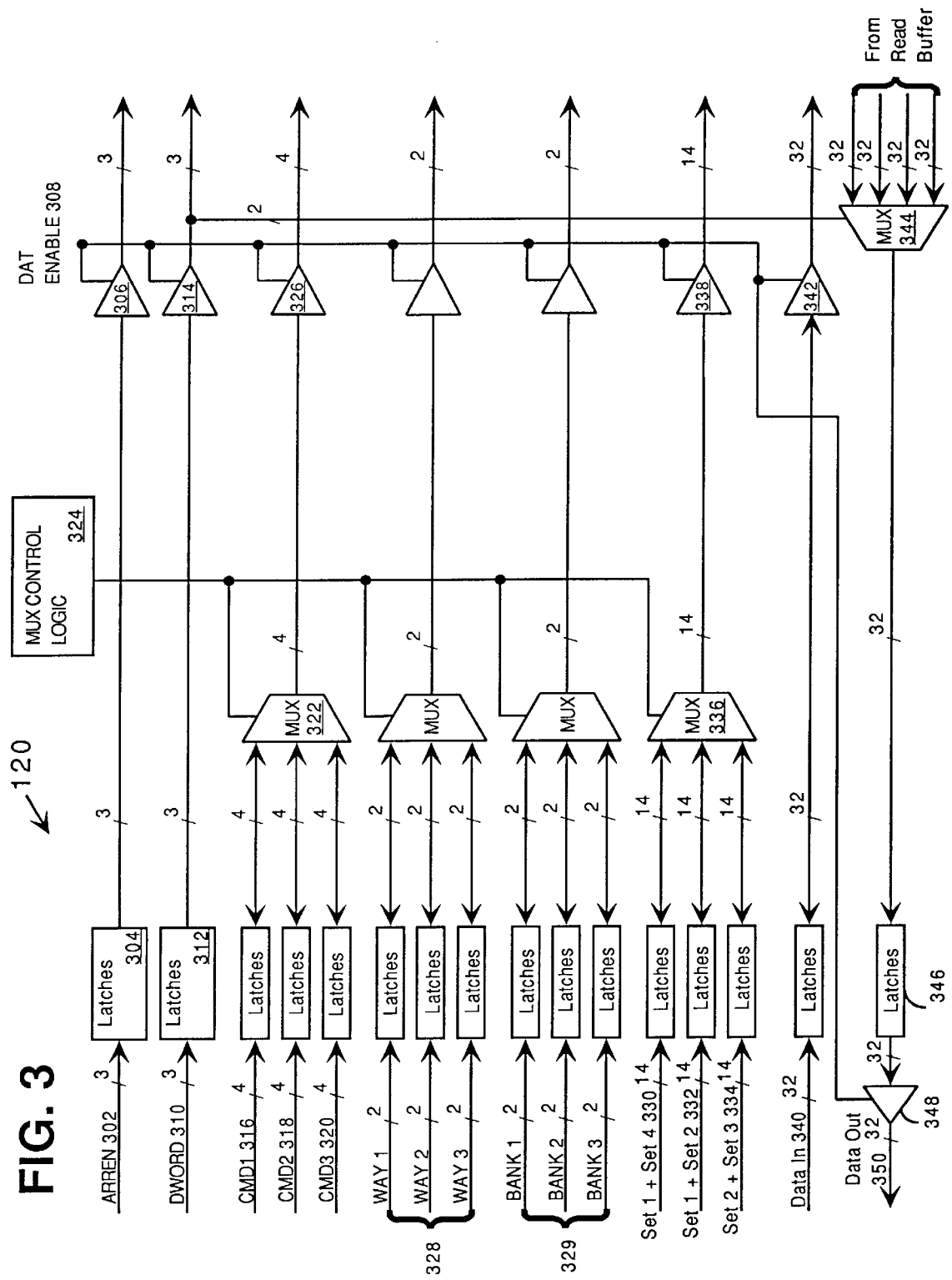
FIG. 3 is a block diagram illustrating the direct access test control logic according to one embodiment of the present invention.

FIG. 3 is a block diagram illustrating the direct access test control logic according to one embodiment of the present invention. DAT control logic 120 operates in the core clock domain. Thus, each of the latches illustrated in FIG. 3 is clocked by the core clock.

As illustrated, DAT control logic 120 receives array enable (ARREN) signals 302 which are latched into latches 304. It is to be appreciated that latches 304 comprise three latches, one for each of the three ARREN signals 302. The latched ARREN signals 302 are then input to drivers 306. It is to be appreciated that drivers 306 comprise three drivers, one for each of the three ARREN signals 302. Drivers 306 are controlled by a DAT enable signal 308. In the illustrated embodiment, drivers 306 are only enabled when the DAT enable signal 308 is asserted. In the illustrated embodiment, the DAT enable signal 308 is generated from a configuration register (not shown) which indicates whether the processor is currently in DAT mode, as discussed above. Thus, the signals from DAT control logic 120 are only output to the embedded memories when DAT mode is enabled. Similarly, the double word (DWORD) signals 310 are latched into latches 312 and provided to drivers 314. Drivers 314 are also enabled by DAT enable signal 308.

Three groups of command signals, CMD1 316, CMD2 318, and CMD3 320 are also latched and input to four three-to-one multiplexers (MUXs) 322. One of the three groups of command signals CMD1 316, CMD2 318, and CMD3 320 are output by MUX 322 to drivers 326 in any given core clock cycle. Which group of command signals CMD1 316, CMD2 318, and CMD3 320 is output by MUX 322 is determined by MUX control logic 324. MUX control logic 324 controls MUX 322 to output a different group of command signals each core clock cycle. Thus, given the 3:1 core clock to bus clock ratio, three groups of commands can be received in parallel by DAT control logic 120 in a bus clock cycle, and a different group of command signals will be output by DAT control logic 120 each of the three different clocks cycles.

Three groups of way signals 328 and bank signals 329 are also latched and input to a multiplexer analogous to the three groups of command signals CMD1 316, CMD2 318, and CMD3 320.

Four groups of set signals are also received and selected pairs 330, 332, and 334 of the four sets are latched as illustrated. These set pairs are input to two MUXs 336 which in turn output a different pair to drivers 338 in each core clock cycle. The set signals are provided in pairs to allow two different addresses to be provided to the dual-ported memory cells.

Input data 340 is also latched and routed to the embedded memories via drivers 342 as illustrated.

In the illustrated embodiment, output data is received from the read buffers of the embedded memories, which in one embodiment of the present invention are 128-bit buffers. For the embedded memories which include 256-bit cache lines, the DWORD[2] signal is used to select either the high or low 128-bits of the 256-bit cache line. The output data from the read buffers is input to 32 four-to-one MUXs 344, and one group of 32 bits is output to latches 346. MUXs 344 are controlled by the DWORD[1:0] signals as illustrated. The output of latches 346 is then provided, through drivers 348, as the output data 350 of DAT control logic 120, data out 118 of FIG. 1.

Thus, it can be seen that DAT control logic 120 "reconfigures" the input and output data and control signal paths. When DAT mode is enabled, DAT control logic 120 reconfigures the signal paths to provide the signals directly to the embedded memory. However, when DAT mode is disabled, DAT control logic 120 does not reconfigure the signal paths to provide the signals directly to the embedded memory.

Figure 4:
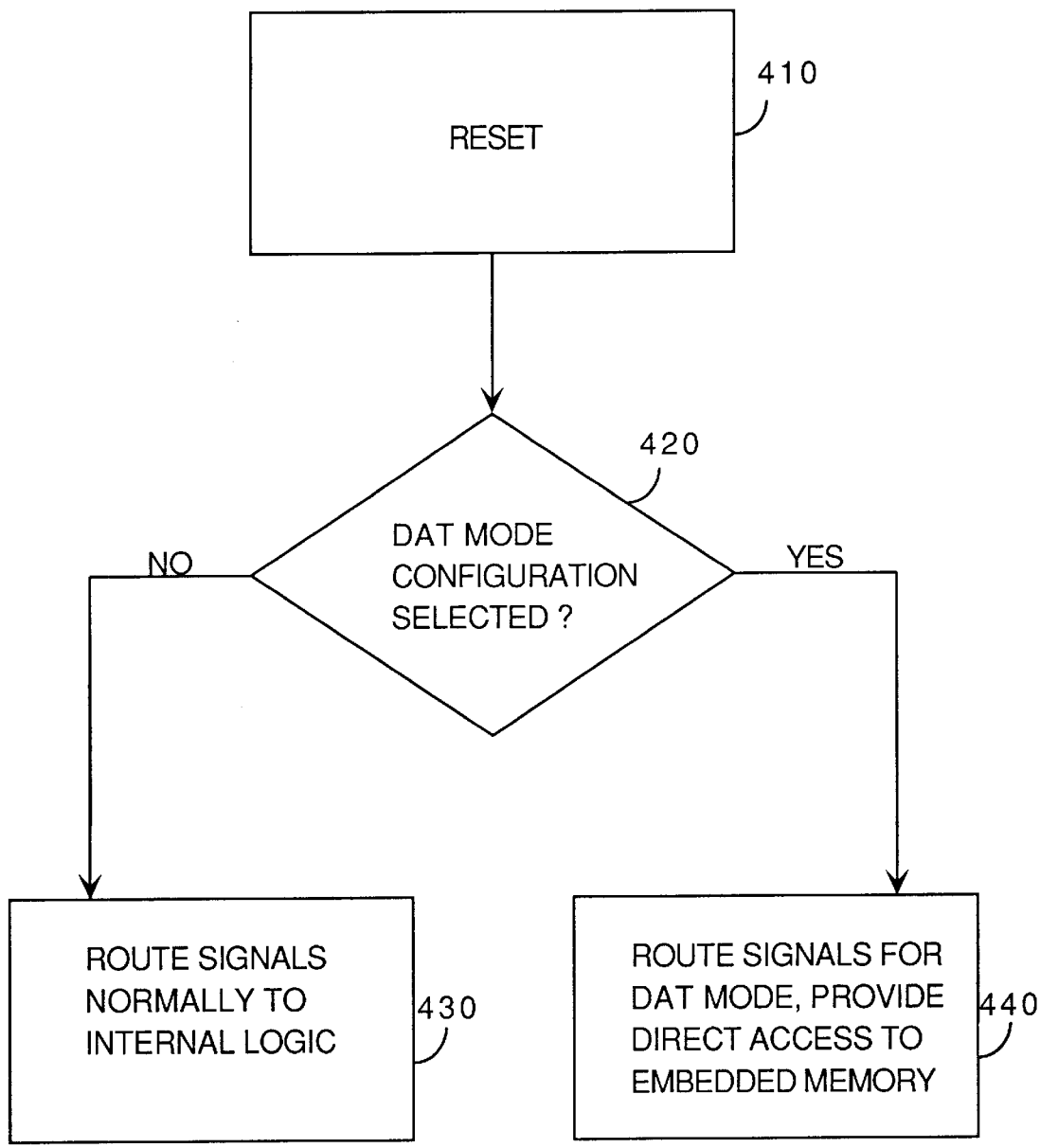
FIG. 4 is a block diagram illustrating the steps followed in providing direct access testability of embedded memory in a processor according to one embodiment of the present invention.

FIG. 4 is a block diagram illustrating the steps followed in providing direct access testability of embedded memory in a processor according to one embodiment of the present invention. A system reset first occurs, step 410. The system can be reset in any of a wide variety of conventional manners, including powering-on of the system, activation of a reset button, etc. During system initialization following the reset, DAT control logic 120 of FIG. 1 checks whether the DAT mode configuration has been selected, step 420. As discussed above, the DAT mode configuration is selected by assertion of the A#[30] signal during reset. If the DAT mode configuration has not been selected then DAT control logic 120 does not reroute any signals and the processor operates in "normal" mode. However, if the DAT mode configuration has been selected, then DAT control logic 120 routes the signals for DAT mode, providing direct access to the embedded memories, step 440.

In the illustrated embodiment, once the determination has been made as to whether the DAT mode configuration has been selected, the system continues to operate in either normal mode or DAT mode until another system reset occurs. In alternate embodiments, the processor can be taken out of DAT mode during operation without requiring a system reset.

Figure 5:
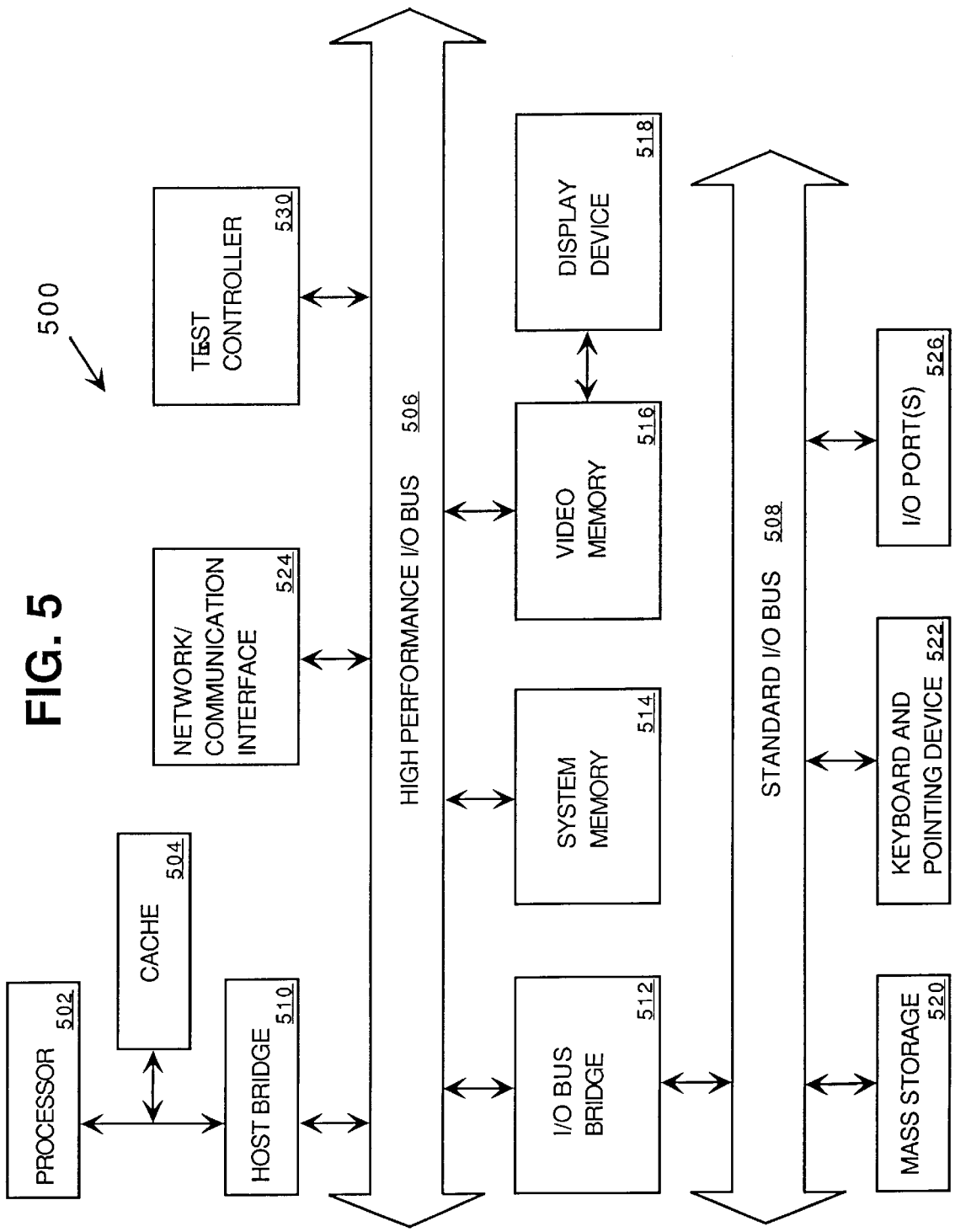
FIG. 5 illustrates a hardware system or machine suitable for use as a host or server system according to one embodiment of the present invention.

FIG. 5 illustrates a hardware system or machine in which the present invention can be practiced according to one embodiment of the present invention. In the illustrated embodiment, hardware system 500 includes processor 502 and cache memory 504 coupled to each other as shown. In one embodiment, processor 100 of FIG. 1 is a processor 502 of FIG. 5. Additionally, hardware system 500 includes high performance input/output (I/O) bus 506 and standard I/O bus 508. Host bridge 510 couples processor 502 to high performance I/O bus 506, whereas I/O bus bridge 512 couples the two buses 506 and 508 to each other. Coupled to bus 506 are network/communication interface 524, system memory 514, and video memory 516. In turn, display device 518 is coupled to video memory 516. Coupled to bus 508 is mass storage 520, keyboard and pointing device 522, and I/O ports 526. Collectively, these elements are intended to represent a broad category of hardware systems, including but not limited to general purpose computer systems based on the Pentium® processor, Pentium® Pro processor, or Pentium® II processor manufactured by Intel Corporation of Santa Clara, Calif.

These elements 502–526 perform their conventional functions known in the art. In particular, network/communication interface 524 is used to provide communication between system 500 and any of a wide range of conventional networks, such as an Ethernet, token ring, the Internet, etc. It is to be appreciated that the circuitry of interface 524 is dependent on the type of network the system 500 is being coupled to. I/P ports 526 are one or more serial and/or parallel communication ports used to provide communication between additional peripheral devices which may be coupled to hardware system 500.

Test controller 528 provides a user connection to the bus 506 and thus processor 502 for testing purposes. According to one embodiment of the present invention address, data, and control signals can be provided to processor 502 by test controller 528 for testing the embedded memory of processor 502.

It is to be appreciated that various components of hardware system 500 may be re-arranged. For example, cache 504 may be on-chip with processor 502. Alternatively, cache 504 and processor 502 may be packaged together as a "processor module" and attached to a "processor card", with processor 502 being referred to as the "processor core". Furthermore, certain implementations of the present invention may not require nor include all of the above components. For example, mass storage 520, keyboard and pointing device 522, display device 518 and video memory 516, host bridge 510, test controller 528, and/or cache 504 may not be included in system 500. Additionally, the peripheral devices shown coupled to standard I/O bus 508 may be coupled to high performance I/O bus 506; in addition, in some implementations only a single bus may exist with the components of hardware system 500 being coupled to the single bus. Furthermore, additional components may be included in system 500, such as additional processors, storage devices, or memories.

Thus, it can be seen that the present invention provides an improved way to test embedded memory of a processor by making the embedded memory directly accessible from external to the processor. It can be seen that the present invention advantageously makes substantial use of pre-existing logic and circuitry to perform the memory testing, thereby reducing the amount of additional chip real estate taken up by the memory testing logic.

Thus, a method and apparatus for direct access test of embedded memory has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. A microprocessor comprising:
   an embedded memory, the embedded memory including a tag memory;
   a plurality of input connectors to receive input signals from an external bus;
   a plurality of output connectors to provide output signals to the external bus;
   a plurality of reconfigurable input and output signal paths, coupled to the embedded memory and the plurality of input and output connectors, which, when the microprocessor is operating in a direct access test mode, provide the input signals from an external bus directly to the embedded memory and the output signals directly from the embedded memory to the external bus and disable normal operation of the microprocessor;
   a dedicated memory test queue, coupled to the plurality of reconfigurable input and output signal paths, configured to receive and store a plurality of memory testing commands when coupled to the external bus in a single external bus clock cycle; and
   dedicated direct access test mode control logic, coupled to the dedicated memory test queue, configured to provide the plurality of memory testing commands to the embedded memory serially over a plurality of consecutive microprocessor clock cycles, the plurality of microprocessor clock cycles being equal in duration to the single external bus clock cycle.

2. The microprocessor of claim 1, wherein the plurality of reconfigurable input and output signal paths are configured to prevent the input signals from being directly input to the embedded memory when in a second operating mode.

3. The microprocessor of claim 1, wherein the embedded memory includes a plurality of cache memory arrays.

4. The microprocessor of claim 1, wherein the dedicated memory test queue is further operative to receive and store array, set, and way information corresponding to each of the plurality of commands.

5. A system comprising:
   a bus configured to generate a bus clock cycle of a first duration; and
   an apparatus configured to generate an apparatus clock cycle of a second duration and coupled to the bus, the apparatus including,
   an embedded memory,
   a plurality of input connectors to receive input signals from the bus;
   a plurality of output connectors to provide output signals to the bus; and
   a plurality of reconfigurable input and output signal paths, coupled to the embedded memory and the plurality of input and output connectors configured to provide the input signals directly to and the output signals directly from the embedded memory when the apparatus is operating in a direct access test mode,
   a plurality of latches, coupled to the plurality of reconfigurable input and output signal paths, to receive and store a plurality of memory testing commands from the bus in a single bus clock cycle, and
   test mode control logic, coupled to the plurality of latches, to provide the plurality of memory testing commands to the embedded memory serially over a plurality of apparatus clock cycles, wherein the first duration is a multiple of the second duration.

6. The system of claim 5, wherein the plurality of reconfigurable input and output signal paths are configured to prevent the input signals from being directly input to the embedded memory when the apparatus is operating in a second operating mode.

7. The system of claim 5, wherein the plurality of latches are further configured to receive and store array, set, and way information corresponding to each of the plurality of commands.

8. A method of operating a microprocessor comprising:
   checking whether a direct access test mode is selected;
   receiving input signals from an external source;
   providing the input signals directly to an embedded memory if the direct access test mode is selected;
   receiving a plurality of memory testing commands in a single bus clock cycle, the bus clock cycle having a first duration;
   storing the plurality of memory testing commands in a memory test queue; and
   providing the plurality of memory testing commands to the embedded memory serially over a plurality of microprocessor clock cycles, a microprocessor clock cycle of the plurality of microprocessor clock cycles having a second duration, wherein the second duration is a fraction of the first duration.

9. The method of claim 8, further comprising preventing the input signals from being directly input to the embedded memory if the direct access test mode is not selected.

10. The method of claim 8, wherein the checking comprises checking, in response to a reset signal, whether the direct access test mode is selected.

* * * * *